US006192500B1

United States Patent
Yang et al.

(12) United States Patent
(10) Patent No.: US 6,192,500 B1
(45) Date of Patent: Feb. 20, 2001

(54) METHOD AND APPARATUS FOR ENHANCED PERFORMANCE IN A SYSTEM EMPLOYING CONVOLUTIONAL DECODING

(75) Inventors: Ganning Yang; Yongbing Wan, both of Irvine, CA (US)

(73) Assignee: Conexant Systems, Inc., Newport Beach, CA (US)

(*) Notice: Under 35 U.S.C. 154(b), the term of this patent shall be extended for 0 days.

(21) Appl. No.: 09/021,898

(22) Filed: Feb. 11, 1998

(51) Int. Cl.$^7$ .................................................. H03M 13/03
(52) U.S. Cl. ............................................................ 714/786
(58) Field of Search ................................. 714/786, 790, 714/758, 780, 792; 375/280, 316, 340, 324

(56) References Cited

U.S. PATENT DOCUMENTS

| 5,408,502 | | 4/1995 | How | 375/340 |
|---|---|---|---|---|
| 5,668,820 | * | 9/1997 | Ramesh et al. | 714/786 |
| 5,671,253 | * | 9/1997 | Stewart | 375/316 |
| 5,673,291 | * | 9/1997 | Dent | 375/262 |
| 5,878,085 | * | 3/1999 | McCallister et al. | 375/280 |
| 5,983,174 | * | 11/1999 | Wong et al. | 704/228 |
| 5,983,384 | * | 11/1999 | Ross | 714/755 |
| 6,005,897 | * | 12/1999 | Mc Callister et al. | 375/340 |

FOREIGN PATENT DOCUMENTS 60-142626   7/1985 (JP) .

OTHER PUBLICATIONS

Haccoun, David et al., "High–Rate Punctured Convolutional codes for Viterbi and Sequential Decoding", *IEEE Transactions on Communications*, vol.37, No. 11, Nov. 1, 1989, pp. 1113–1125.

Hagenauer, J. "Rate–Compatible Punctured Convolutional Codes (RCPC Codes) and Their Applications", *IEEE Transactions on Communications*, vol.36, No. 4, Apr. 1, 1988, pp. 389–400.

International Search Report, Jun. 22, 1999.

* cited by examiner

Primary Examiner—Albert De Cady
Assistant Examiner—Shelly A Chase
(74) Attorney, Agent, or Firm—Knobbe, Martens, Olson & Bear, LLP

(57) ABSTRACT

The invention comprises a method and apparatus for decoding an incoming symbol stream comprised of a plurality of known missing symbols. Within the incoming symbol stream, those symbols corresponding the known missing symbols are replaced with a first set of values to create a modified symbol stream. The modified symbol stream is convolutionally decoded to produce a first decoded information bit stream. An error detection mechanism is performed on the first decoded information bit stream to determine a "pass" or "fail" indication. If the error detection mechanism produces a "fail" indication, a second set of values replaces the known missing symbols to produce a second modified symbol stream. The second modified symbol stream is convolutionally decoded to produce a second decoded information bit stream. The error detection mechanism is performed on the second decoded information bit stream. If the error detection mechanism produces a "pass" indication, the second decoded information bit stream is passed to the next processing layer. Additional repetitions can be completed until an error free decode is obtained or a predetermined number of attempts is completed without a "pass."

21 Claims, 5 Drawing Sheets

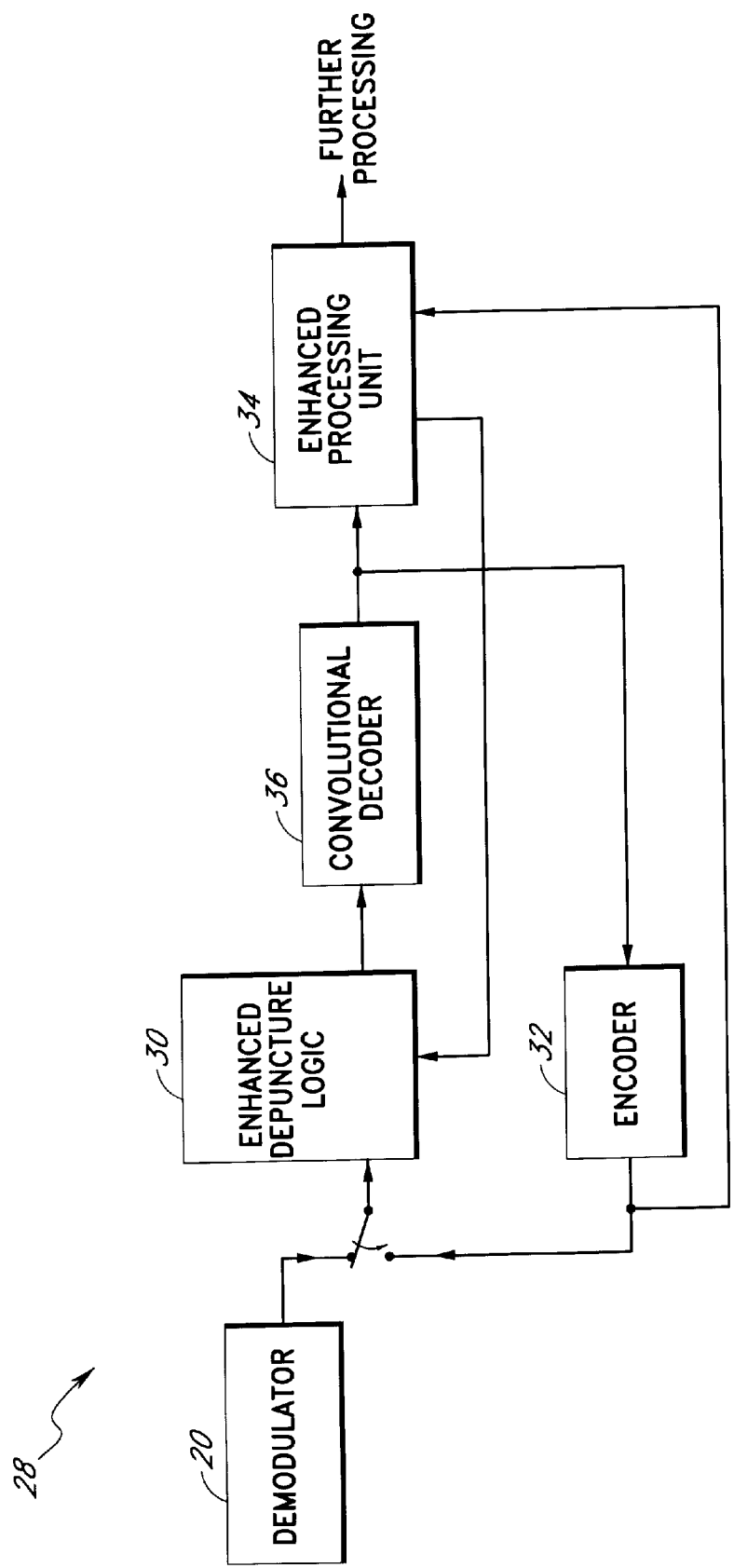

METHOD AND APPARATUS FOR ENHANCED PERFORMANCE IN A SYSTEM EMPLOYING CONVOLUTIONAL DECODING

BACKGROUND OF THE INVENTION

I. Field of the Invention

The invention relates to communication systems. More particularly, the invention relates to a communication system using convolutional decoding.

II. Description of the Related Art

In modern day communication systems, the channel provided to connect two communications units can introduce a significant number of errors into the data which is passed over the channel. For example, a wireless channel is especially prone to introduce errors. Errors may occur from extraneous signal energy on the channel such as energy introduced by thermal noise, other users of the same system, and other systems operating within the same geographic region. In addition, especially in a terrestrial wireless channel, the channel is subject to multipath fading effects which may cause a signal to interfere with itself.

Modern encoding techniques have been developed in order to promote the successful transfer of data over an imperfect channel. These techniques allow a receiving unit to detect and correct for errors introduced during the transmission process.

FIG. 1 is a block diagram showing a conventional transmitting unit 2 and a receiving conventional unit 18 using a convolutional encoding and a data puncturing scheme. A convolutional encoder 4 encodes the incoming information bit stream. The convolutional encoder 4 responds to the information bit steam and creates a symbol stream by the introduction of redundancy and symbol interdependence so that error correction may be performed at the receiving unit 18.

A typical convolutional encoder 4 is comprised of a series of shift registers such as shift registers 6A–6D. As each information bit is received, each of the shift registers 6A–6C transfers its content to the next successive shift register 6B–6D and receives a new input bit directly from the information bit stream or the preceding shift register. The content of shift register 6D is discarded when the next information bit is received.

The output of selected ones of shift registers 6A–6D are connected to adders 8A and 8B such that each of the adders 8A and 8B produces one symbol digit for each information bit that is received. Note that not all of the shift registers 6A–6D are connected to each of the adders 8A and 8B and that the shift registers which are connected to the adder 8A are different from those connected to the adder 8B such that the output sequence from the adder 8A is different from the output sequence from the adder 8B. Thus, each time that a new information bit is shifted into the convolutional encoder 4, the convolutional encoder 4 produces two distinct symbols. For this reason, the convolutional encoder 4 is said to produce rate one-half (R=½) encoded symbols.

As each bit shifts into the convolutional encoder 4, its value contributes to determining the value of the symbols output by the adders 8A and 8B for five information bit increments. For this reason, the particular convolutional encoder 4 is said to have a constraint length equal to five (K=5). In this way, redundancy and symbol interdependence is introduced through the encoding process. Due to the redundancy and symbol interdependency introduced by the convolutional encoder 4, an error-free information bit stream may be decoded at the receiving unit even if a portion of the symbols are missing or corrupted.

In addition to the symbol data which is lost or corrupted as it is passed over the error-prone channel, the transmitting unit may purposefully delete or overwrite a portion of the symbol data. For instance, when constrained by a given communication system, convolutional encoding may result in more bits than can be transmitted within the constraints of the system. Accordingly, bits are often deleted after convolutional encoding. The deletion of the bit is often known as "puncturing." For the deletion of bits, the bits are typically punctured in accordance with a known pattern such as one of every n bits. Accordingly, the decoder is able to determine which bits have been punctured at the receiving end because the puncturing occurs according to a predetermined pattern. In conventional systems, the receiver, such as the receiver 18 includes depuncture logic which is configured with the pattern and fills the punctured bits (i.e., inserts bits to fill in for the punctured bits) with zeros. The depuncture logic does not typically fill with a logic "zero," but in a system where logical "1" is represented by a negative one and logical "0" is represented by a positive one, the depuncture logic fills in a value of zero, that being the value halfway between one and negative one. The receiving unit then provides a simple convolutional decoding operation 24 using the filled bits in place of the punctured bits which were removed at the transmitting end.

The transmitting unit 2 of FIG. 1 uses a data puncturing scheme. The output of the convolutional encoder 4 is passed to puncture logic 10. The puncture logic 10 punctures the symbol data removing bits according to a known pattern. The number of bits is thereby decreased, and passed to the modulator 12. The modulator 12 modulates the data. And the modulated symbol stream is transmitted over the communication channel. At the receiving unit 18, a demodulator 20 may create soft decision data. Soft decision data essentially reflects the probability that the symbol data was properly received. For example, if the incoming stream of data is assumed to be a stream of 1's and −1's, the demodulator 20 may produce data quantized into a number of discrete values between 1 and −1. If the signal energy for a particular bit is high, the demodulator 20 produces an absolute symbol value close to 1. As the symbol energy decreases, the demodulator 20 produces symbol values which approach zero. The soft decision data is passed to the depuncture logic 22. The depunctured logic fills in the punctured bits according to the known pattern with erasures. Erasures are zeros which reflect neither a one nor a negative one. The depuncture logic 22 then passes the resulting data stream to the convolutional decoder 24.

Due to the redundancy introduced by the convolutional encoder 4, error-free data may be recovered from the punctured symbol stream by the convolutional decoder 24. Standard convolutional decoders make use of the additional information available in soft decision data to recover the transmitted sequence with an even higher reliability than achieved with "hard decision" values. (Hard decision values result if each incoming symbol data is mapped into either a 1, a −1 or a 0 rather than a plurality of non-unity, non-zero values as well.) Additional information concerning soft-decision decoding may be found in the second edition of "Digital Communications" by John G. Proakis, published by McGraw-Hill in 1989. Additional information of convolutional decoding in general may be found in the book entitled "Trellis Decoding of Block Codes: A Practical Approach" by Bahram Honary and Gerik Markarian published by Kluwer Academic Publishers in 1997.

The convolutional decoder 24 produces a maximum likelihood decoded information bit stream which is passed to a processing unit 26. The processing unit 26 may use a variety of means well-known in the art to determine whether the decoded information bit stream accurately reflects the transmitted information bit stream. For example, the incoming information bit stream may comprise a cyclic redundancy check (CRC) sequence which can be used to detect errors at the receiving unit 18. In the case of voice data, erroneously received information bits may be discarded before the bit stream is passed to a voice decoder. In the case of digital data transfer, the erroneously received information bits may be retransmitted by the transmitting unit.

Alternatively, as shown in FIG. 2, rather than delete the bits from the convolutional encoded data stream, a multiplexer 11 replaces some of the bits with supplemental information bits. This still results in bits being punctured from the primary data stream, but the punctured bits are replaced with additional bits. Other than the multiplexer 11, the transmitting unit 3 is the same as the transmitting unit 2 of FIG. 1. Accordingly, in this embodiment, the actual number of bits transmitted is not reduced. However, the number of bits from a particular convolutionally encoded bit stream is reduced. The resulting bit stream is passed to the modulator 12 which is then transmitted over the communication channel as described above. Similarly, as described above, the demodulator 20 receives the transmitted data which is then provided to a demultiplexer 23. The demultiplexer 23 divides the supplemental information bits from the primary symbol stream and replaces the missing symbols with erasures as described above. The resulting symbol stream is provided to the convolution decoder 24 as described above.

The supplemental information may be control information which is used to govern the link. For example, the supplemental information may be power control information, handover information, or paging information. The supplemental information replaces the symbol data in this way creating a subchannel which piggybacks onto the main information channel. Due to the redundancy and symbol interdependency introduced by the convolutional encoder 3, an error-free information bit stream may be decoded even though a portion of the symbols have been replaced with the punctured data.

The deficiency of the prior art is seen when the combined effect of the punctured data scheme and the channel characteristics increases the error rate beyond an acceptable limit. In a voice system, if the error rate becomes excessive, the decoded voice output becomes difficult to comprehend. In the case of digital data transfer, an increase in error rate can greatly reduce the effective data rate of the system if system resources are continually consumed by the repetition of erroneously received data.

SUMMARY OF THE INVENTION

The inventors recognized a need in the industry to have a means and method of enhancing the performance of a system using convolutional decoding with punctured bits.

The invention comprises a method and apparatus for an enhanced performance in systems employing convolutional decoding with punctured symbols. At the receiving unit, within the demodulated symbol stream, the punctured symbols are replaced with a first set of values, typically erasures. The resulting symbol stream is convolutionally decoded. The receiving unit then performs an error detection scheme in order to determine whether the decoded information bits output from the convolutional decoding process are properly decoded. If no error is detected, the decoded information bit stream may be passed to the next processing layer. If an error is detected, the receiving unit inserts a new set of values including at least some non-zero values within the resultant symbol stream in place of the punctured symbols. The modified symbol stream is once again convolutionally decoded. Once again, the receiving unit performs error detection to determine whether the decoded information stream decoded properly. If the decoded information bit stream decoded properly, it may be passed to the next processing layer. If it did not properly decode, the receiving unit may determine yet another set of non-zero values to insert in place of the known missing symbols. For each group of data which is successfully decoded upon one of these successive attempts, the error rate of the system is decreased, thereby enhancing the performance of the system. In one embodiment, the selection of the filling values may be based upon a re-encoding process as explained further below.

One aspect of the present invention involves a method of decoding an incoming symbol stream. The symbol stream has a first plurality of bits which originate from an original plurality of bits from which ones of said original plurality of bits were deleted. The method comprises the steps of filling said first plurality of bits with a first set of replacement values having at least some non-zero values to replace the deleted ones of the original plurality of bits to generate a first reconstructed approximation of the original plurality of bits, convolutional decoding the first reconstructed approximation of the original plurality of bits to produce a first decoded information bit stream, performing error detection on the first decoded information bit stream, and indicating whether errors are present in said first decoded information bit stream.

In one embodiment, this method further involves, if the first decoded information bit stream contains errors, modifying the first set of replacement values with a second set of replacement values, different at least in part from the first set of replacement values to create a second reconstructed approximation of the original plurality of bits, convolutional decoding the second reconstructed approximation to produce a second decoded information bit stream, performing the error detection on the second decoded information bit stream, and indicating whether errors are present in the first decoded information bit stream.

In a further embodiment, if errors are detected in the second decoded information bit stream, the steps of modifying, convolutional decoding, performing and indicating are repeated until a predetermined or maximum number of attempts is completed or an error free bit stream is detected. Advantageously, the incoming symbol stream comprises soft decision data values. In a further embodiment, the second set of replacement values comprises at least some small non-zero values.

In one embodiment, the method involves re-encoding the first decoded information bit stream to produce a first re-encoded symbol stream and using the re-encoded symbol stream in a determination of at least some values within said second set of replacement values.

Another aspect of the present invention involves a method of decoding an incoming symbol stream where the incoming symbol stream is an original symbol stream having a first plurality of bits. The first plurality of bits is made up of an original plurality of bits with ones of the original plurality of bits deleted. The method involves the steps of filling the first plurality of bits with a first set of replacement values which replace the deleted ones of the original plurality of bits to create a first modified symbol stream, convolutionally decoding the first modified symbol stream to produce a first decoded information bit stream, performing error detection on the first decoded information bit stream, and if errors are present in said decoded information bit stream, further performing additional steps filling the first plurality of bits with a second set of replacement values to replace the deleted ones of the original plurality of bits, the second set of replacement values different, at least in part, from the first set of replacement values to generate a second modified symbol stream, convolutionally decoding the second modified symbol stream to produce a second decoded information bit stream, and performing error detection on the second decoded information bit stream.

In one embodiment, an additional step of re-encoding the first decoded information bit stream to produce a first re-encoded symbol stream is completed, and the information from the re-encoded symbol stream is used in the determination of the value or polarity of the second set of replacement values.

In one embodiment, the incoming symbol stream comprises soft decision data values and the first set of values is a set of erasure values and the second set of values is a set of at least one non-zero value. In yet another embodiment, the polarity of at least one value of said second set of values is determined based on the result of the first convolutional decoding step.

In one embodiment, the step of performing error detection comprises the steps of calculating a received CRC value for the first decoded information bit stream, comparing the received CRC value to an appended CRC value within the first decoded information bit stream, failing the first decoded information bit stream if the appended CRC value does not match the received CRC value, and passing the first decoded information bit stream if the appended CRC value matches the received CRC value.

Another aspect of the present invention involves a method of decoding an incoming symbol stream comprising a first plurality of bits, the first plurality of bits comprising an original plurality of bits with ones of the original plurality of bits overwritten with alternative bits. The method comprises the steps of receiving the incoming symbol stream, replacing the alternative bits with a first set of replacement values having at least one non-zero value to generate a first reconstructed approximation of the original plurality of bits, convolutionally decoding the first reconstructed approximation to produce a first decoded information bit stream, and performing error detection on the first decoded information bit stream to ascertain whether errors are present in the first decoded information bit stream.

In one embodiment, the method further involves removing the alternative bits from said incoming symbol stream. In another embodiment, the alternative bits are stored.

Another aspect of the present invention involves an apparatus for decoding an incoming symbol stream having a plurality of known missing symbols, the apparatus comprises means for replacing the plurality of known missing symbols with a first set of values to create a first modified symbol stream, means for convolutional decoding the first modified symbol stream to produce a first decoded information bit stream, means for performing error detection on the first decoded information bit stream, means for re-encoding the first decoded information bit stream to produce a first re-encoded symbol stream if the first decoded information bit stream fails the error detection, means for replacing the plurality of known missing symbols within the re-encoded symbol stream with a second set of values to create a second modified symbol stream, means for convolutional decoding the second modified symbol stream to produce a second decoded information bit stream, and means for performing error detection on the second decoded information bit stream.

In one embodiment, the apparatus further comprises means for re-encoding the second decoded information bit stream to produce a second re-encoded symbol stream if the second decoded information bit stream fails the error detection, means for replacing the plurality of known missing symbols within the second re-encoded symbol stream with a third set of values to create a third modified symbol stream, means for convolutional decoding the third modified symbol stream to produce a third decoded information bit stream, and means for performing error detection on the third decoded information bit stream.

In one embodiment, the incoming symbol stream comprises soft decision data values and the first set of values is a set of erasure values. In this embodiment, the second set of values comprises a set of at least one small non-zero value and the third set of values comprises a set of at least one larger non-zero value.

In one embodiment, the incoming symbol stream comprises soft decision data values and the first set of values is a set of erasure values and the second set of values comprises a set having at least one non-zero value.

In another embodiment, the plurality of known missing symbols carry a punctured sub channel.

Yet another aspect of the present invention involves an apparatus for decoding convolutionally encoded symbol data having a plurality of punctured symbols. The apparatus comprises a demodulator having a soft decision symbol output, depuncture logic having a symbol input in communication with the soft decision symbol output of the demodulator, the depuncture logic configured to replace the punctured symbols with at least one non-zero soft decision value, and the depuncture logic having a modified symbol stream output. The apparatus further comprises a convolutional decoder having a symbol input in communication with the modified symbol stream output of the depuncture logic and having a decoded information bit stream output, a processing unit having a data input in communication with the decoded information bit stream output of the convolutional decoder, and an encoder having a bit input in communication with the decoded information bit stream output of the convolutional decoder and a symbol output in communication with the symbol input of said depuncture logic.

In one embodiment, wherein the depuncture logic is configured to receive control, the apparatus further comprises a processing unit in communication with the depuncture logic, the processing unit configured to control the value to use for replacing the punctured symbols, the values being selected from soft decision values.

In another embodiment, the depuncture logic comprises a multiplexer, and the processing unit communicates replacement values to an input of said multiplexer.

In yet another embodiment, the apparatus comprises an error detection module in the processing unit, the error detection module configured to determine whether errors are present in the decoded information bit stream output of the convolutional decoder, the depuncture logic configured to successively replace the puncture symbols with alternate soft decision values until an error-free decoded information bit stream is detected or a maximum number of trials is reached.

BRIEF DESCRIPTION OF THE DRAWINGS

The features, objectives, and advantages of the invention will become more apparent from the detailed description set forth below when taken in conjunction with the drawings:

FIGS. 3 and 3A are block diagrams showing receiving units in accordance with the invention.

DETAILED DESCRIPTION OF THE INVENTION

Convolutional decoders are well-known in the art of communications. A convolutional decoder is an important component of many communication systems. A convolutional decoder is valuable because it allows the recovery of error-free information bits from non-error-free symbol data.

Although the convolutional decoder is a powerful decoding tool, it does not guarantee error-free decoding under all conditions. As the number of symbol errors input into the decoder increases, the probability of an erroneous decoded information bit stream increases.

In a system which is sensitive to errors, typically an error detection mechanism is introduced into the system. The error detection mechanism allows the receiving unit to detect a deviation in the decoded information bit stream as compared to the information bit stream originally transmitted. For example, one common error detection mechanism is the introduction of a cyclic redundancy check (CRC). A CRC value is determined at the transmitting unit by performing a simple algorithm on a group of information bit values. The CRC value is typically appended to the group of information bits. At the receiving unit, after the data has been decoded, the same simple algorithm is performed on the decoded information bits. If the CRC value determined by the receiving unit matches the appended bits as decoded by the receiving unit, the receiving unit assigns the group of information bits a "pass" value. If the CRC value determined by the receiving unit does not match the appended bits as decoded by the receiving unit, the receiving unit assigns the group of information bits a "fail" value.

In a typical prior art system, if the receiving unit assigns a group of information bits a "fail" value, the receiving unit may discard the data and request that the transmitting unit resend the group of information bits. Alternatively, if error-free data is not required by the system (such as is the case for some voice systems), the receiving unit may simply discard the corresponding bits. The invention comprises an alternative to simply discarding data which is assigned a "fail" value by an error detection mechanism.

Because a convolutional decoder is capable of producing error-free information bits from imperfect symbol data, some systems puncture (remove) symbols from the encoded symbol stream as explained above. Typically, the receiving unit then fills (replaces) the removed symbols with erasures. The receiving unit then attempts to convolutionally decode the resulting symbol stream.

Figure 1:
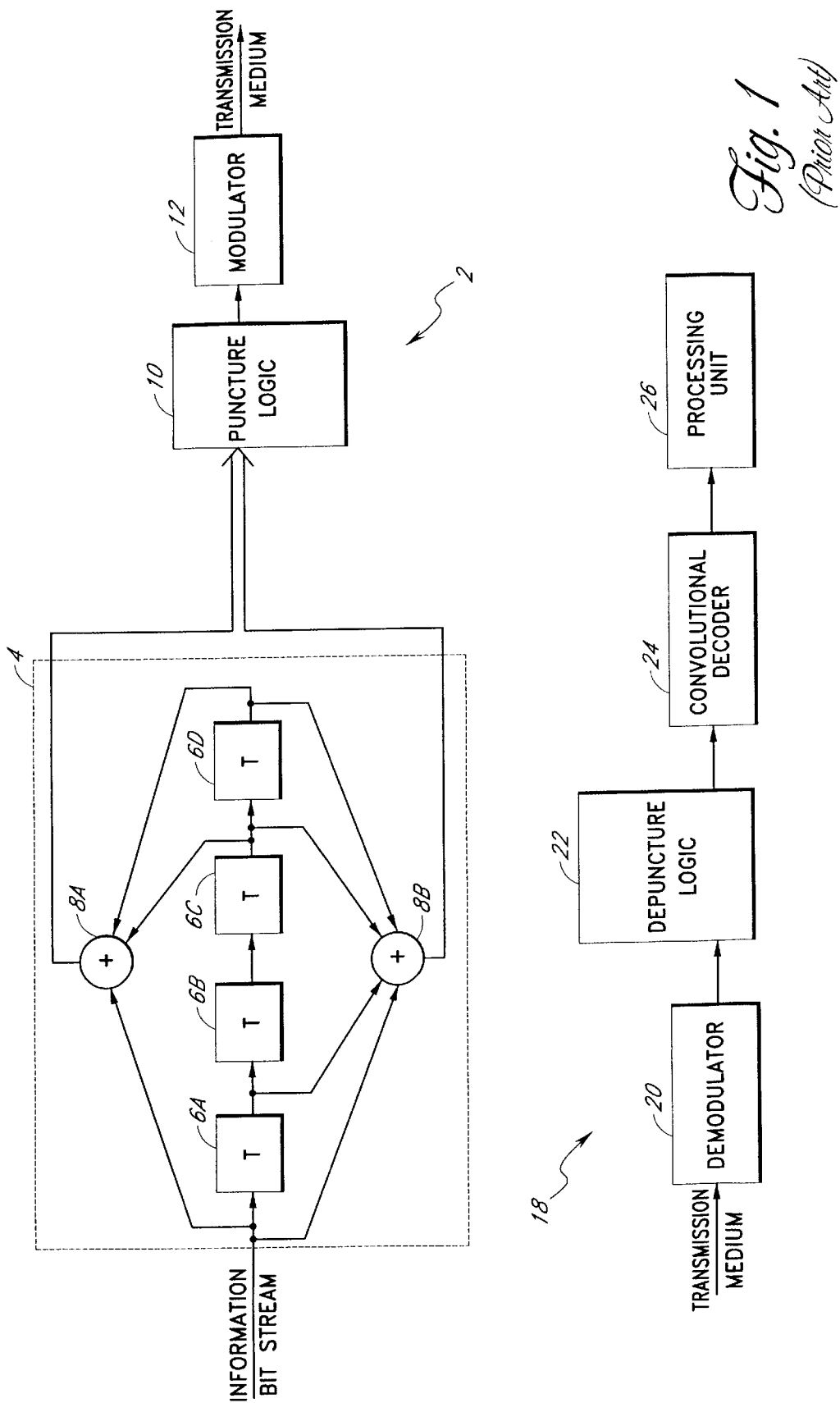
FIGS. 1 and 2 are block diagrams showing a transmitting unit and a receiving unit using conventional convolutional encoding with data puncturing.
Figure 2:
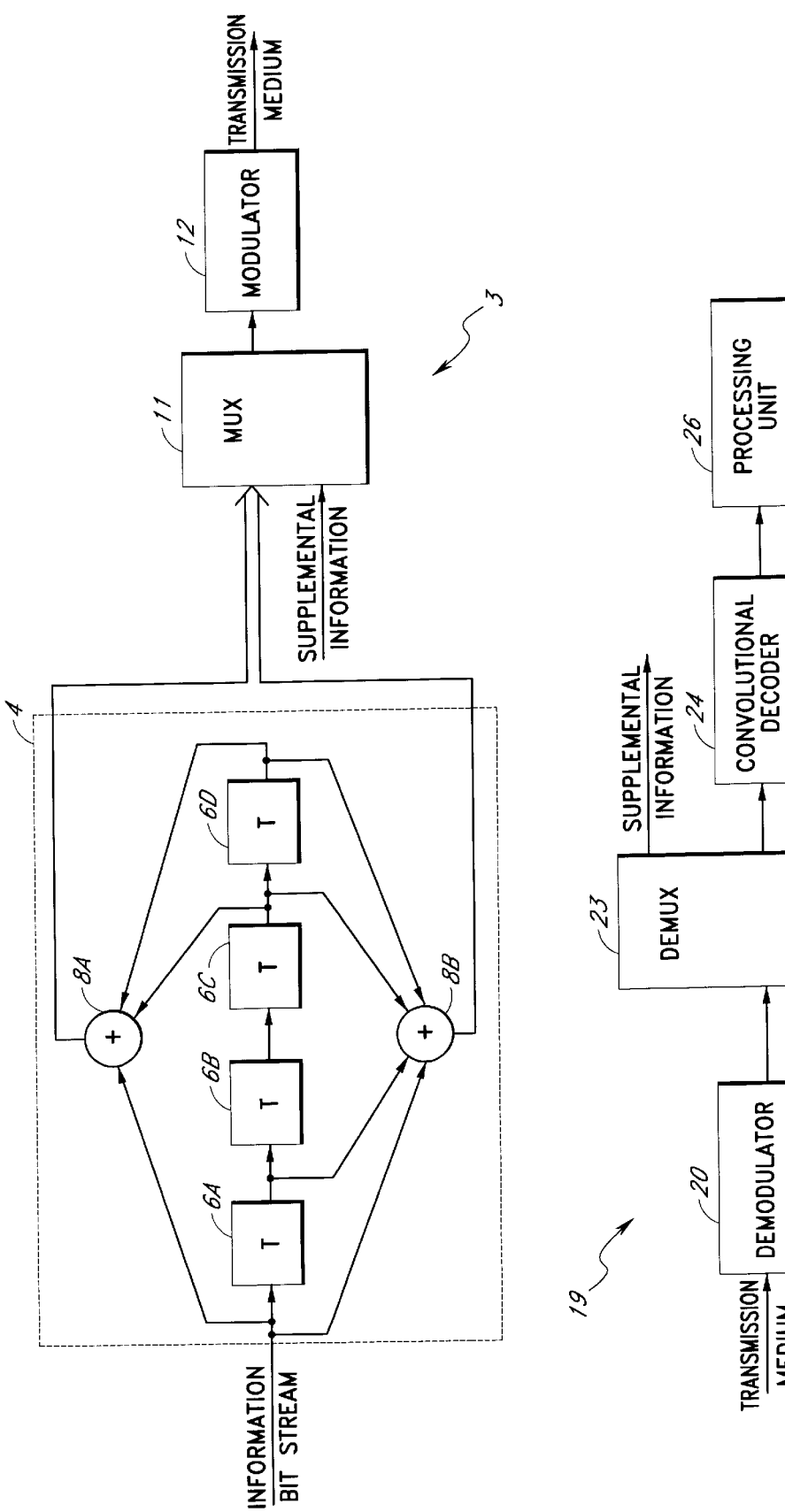

However, systems which incorporate puncturing become less immune to other errors. In some cases, the errors introduced by the channel, when compounded with the effects of the puncturing, cause groups of information bits to decode incorrectly. As briefly described above, in some conventional systems, rather than simply removing bits, supplemental information is placed over the top of some of the bits from the convolutionally encoded data stream, thereby allowing a supplemental channel to be overlaid on the convolutionally encoded data. The supplemental channel may comprise convolutionally encoded data from another bit stream. In such an embodiment, as depicted in FIG. 2, a multiplexer 11 is typically used to replace bits from the convolutionally encoded bit stream. The receiving unit plucks the supplemental channel bits from the incoming symbol stream with a demultiplexer 23. As with the embodiment of FIG. 1, the receiver replaces the now empty symbol slots with erasures (zeros).

FIG. 3 is a block diagram showing a receiving unit 28 according to the present invention. A demodulator 20 may have the same structure as the demodulator of conventional systems. For exemplary purposes, assume that for each symbol received, the demodulator 20 produces soft decision data at one of 16 different quantized levels. The demodulator 20 output is passed to enhanced depuncture logic 30. When the depuncture logic 30 receives input from the demodulator 20, the depuncture logic is configured to fill the punctured bit according to one of several different alternatives for filling the punctured bits.

In one embodiment, the enhanced depuncture logic 30 inserts at least some non-zero symbols to replace the punctured symbol data. At one extreme, the depuncture logic cooperates with the convolutional decoder 36 and the enhanced processing unit 34 (which includes error detection such as a block decoding) to attempt all combinations of possible soft decision quantized values (for instance, each one of the 16 different quantized levels) and convolutionally decodes the resulting bit stream for every possible combination of punctured bits and then computes an error check for each possible combination until a proper or error-free symbol stream is found.

This particular approach is very processing intensive because it requires trying each one of 16 quantized values between one and negative one for each punctured bit. Accordingly, in another embodiment, the receiver 28 attempts convolutional decoding and error detection with less than each of the 16 quantized levels for each bit. For example, the receiver 28 may sequentially replace the punctured bits with one of four of the 16 quantized levels—for example, one, one-half, negative one-half, and negative one. The receiver 28 may convolutionally and block decode each combination of these four levels to determine if an error-free symbol stream is detected. Alternatively, the receiver 28 may fill with random non-zero values ranging in the negative and positive range decode, and complete an error check.

As will be appreciated, many different combinations of non-zero filling can be used in an attempt to reconstruct an error-free symbol stream. In one implementation, the enhanced depuncture logic 30 initially fills with erasures or zeros. The resultant data is passed to the convolutional decoder 36. The decoded data is passed to enhanced processing unit 34 which completes an error check. If the symbol stream is a pass, then no further attempts are necessary. If the symbol stream fails, an additional set of fill values can be attempted which differ from the first set of fill values. Thus, in the second set of fill values, at least one non-zero value will be used. This process can be repeated with different fill values until an error free decode occurs or a predetermined number of attempts fails to produce an error free decode.

In one embodiment, the decoded symbol stream (from filling with erasures or other values) is re-encoded with the encoder 32 to assist in the determination of what values to use for the filling operation. For example, in one embodiment, the punctured bits are filled as follows: an initial fill is made with a predetermined set of values. In one embodiment this is all zeroes, and in another embodiment, the first set of values includes some non-zero values. If the initial attempt does not result in a "pass," the symbol stream can be re-encoded with the encoder 32. If the result (after convolutional decoding, and re-encoding) provided a binary 1 for a punctured bit, then a negative polarity is assigned to the symbol, and if a binary zero was the result of the decode, a positive polarity is assigned for the punctured bit. Preferably, the initial numbers of the particular selected polarities are small (close to zero). With each iteration, the value increases until an error-free symbol stream is detected or a predetermined number of attempts is completed.

The enhanced processing unit 34 performs the error detection process on the decoded information bit stream. If the error detection process indicates a pass, the enhanced processing unit 34 passes the decoded information bit stream to the next processing stage (not shown). No further iterations are necessary.

Figure 3A:
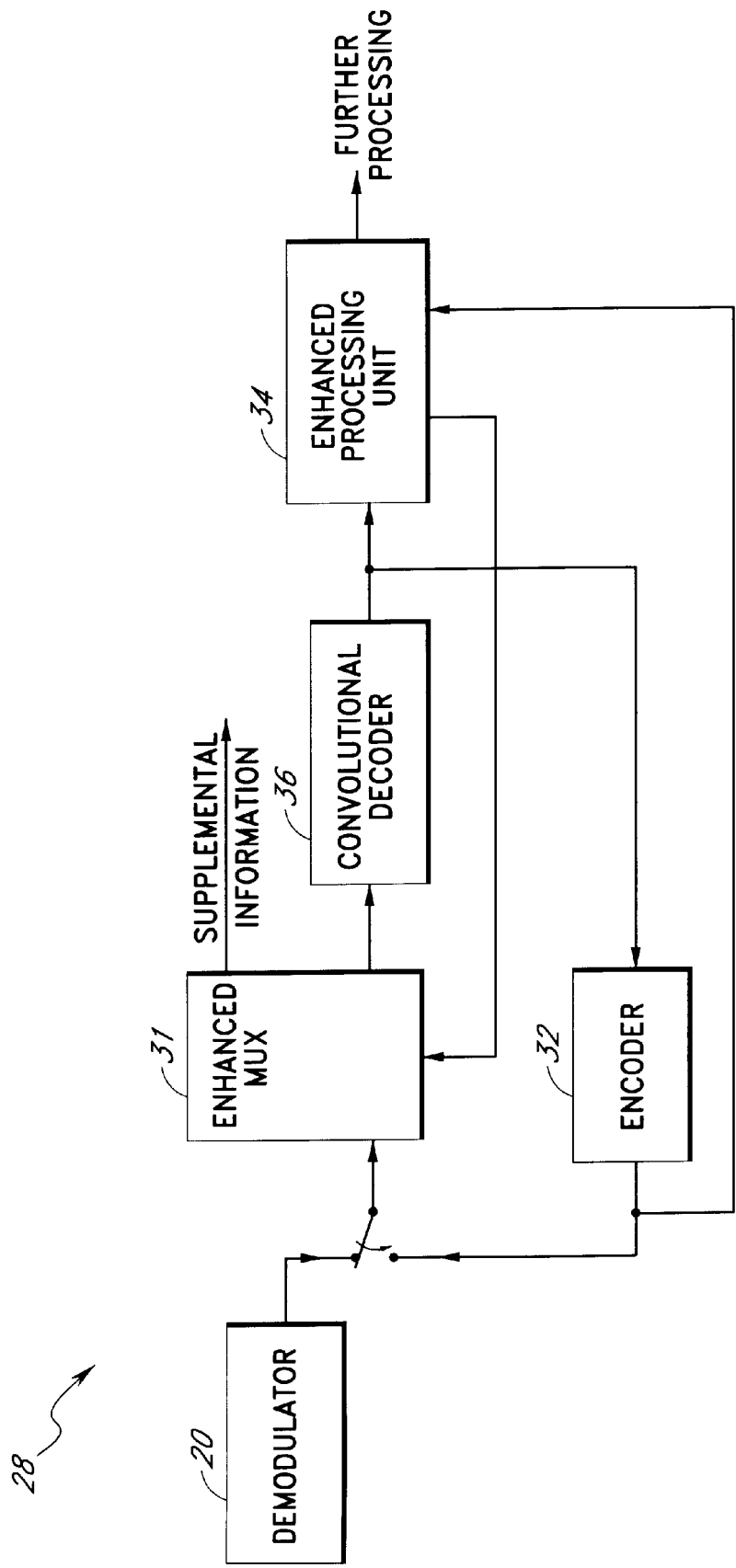

FIG. 3a depicts an alternative embodiment where rather than removing punctured bits, bits are punctured and replaced at the transmitting end with supplemental information as described above. Accordingly, in FIG. 3a, an enhanced multiplexer 31 replaces the depuncture logic 30 of FIG. 3. The only difference from FIG. 3 is that the supplemental information is plucked from the incoming symbols stream and provided to an alternate processing path (not shown). The replacement of the bits plucked from the incoming stream is the same as described above for punctured bits. The punctured bits are then filled with non-zeros or filled with zeros in a progressive state as described above for the embodiment depicted in FIG. 3.

In one embodiment, the polarity and amplitude of the inserted symbols may be determined in a variety of ways. The number of possible permutations of values for the symbol data depends upon the number of punctured symbols which are included within the group of information bits for which the error detection is made. If only one punctured symbol is included within the group, the value of the punctured symbol was either 1 or −1 and the selection process may arbitrarily insert either a 1 or a −1 and repeat the decoding process. If the error detection process again indicates an error, the alternate value may be inserted in the symbol stream which is decoded once again.

As the number of punctured symbols within a symbol stream increases, the number of permutations which might be tested increases beyond a practical limit. For instance, for sixteen levels, the number of possibilities becomes very high. Accordingly, trying values in ranges is advantageous. For each group of data which is successfully decoded based upon the insertion of the non-zero values for the punctured data, the error rate of the system is decreased. Therefore, as the number of punctured symbols within a group increases, it may be advantageous to insert small amplitude values rather than 1 and −1. In this way, the influence of an erroneous guess does not greatly affect the decoding process and the actual received symbol values may continue to significantly influence the decoding process.

Figure 4:
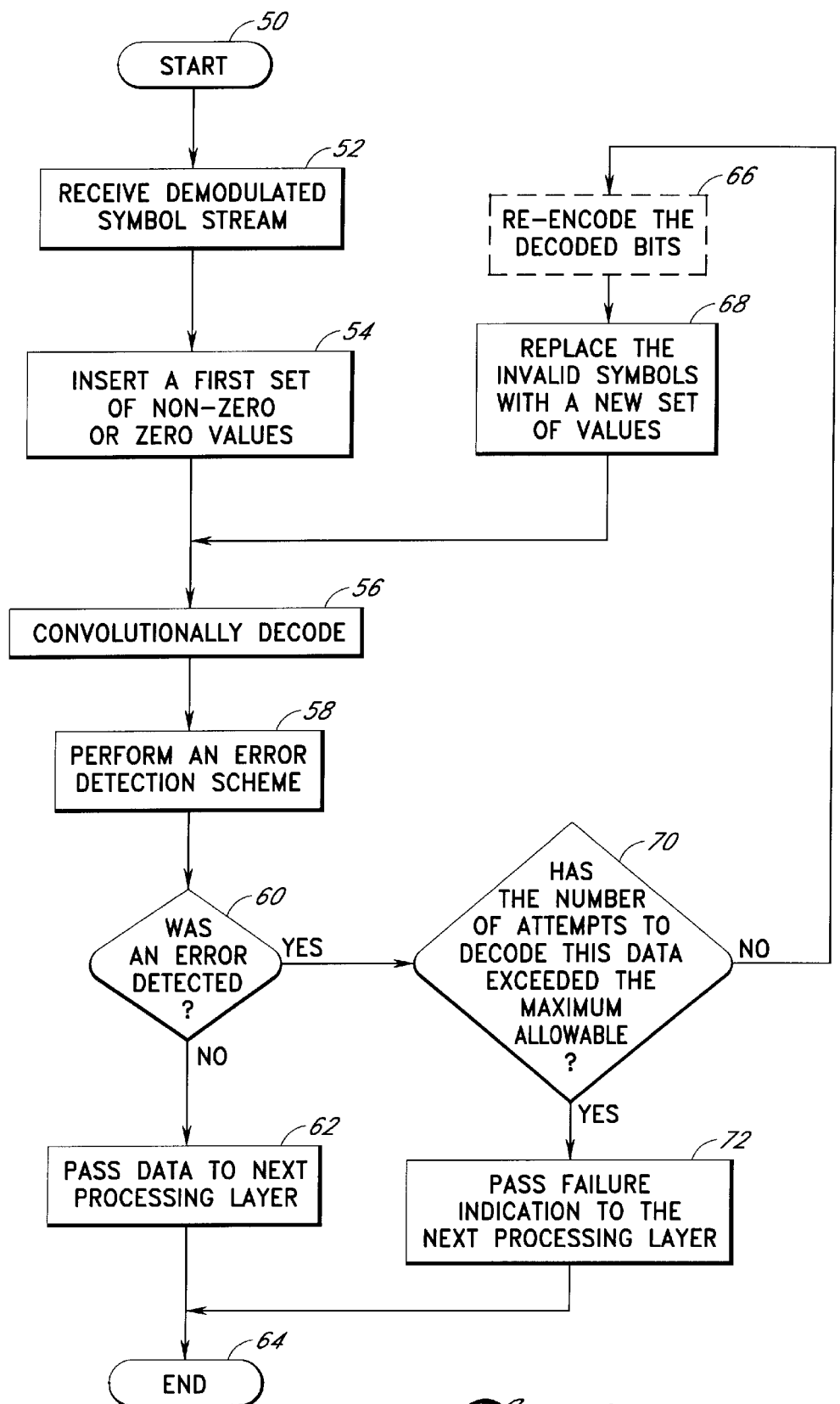
FIG. 4 is a flow chart showing exemplary operation of the invention.

FIG. 4 is a flowchart showing exemplary process flow of the invention. Process flow begins at start block 50. In block 52, a set of demodulated symbols are received. The punctured symbols are replaced with a first set of non-zero values in block 54. Alternatively, zeros are used in the first iteration. The resultant symbols are convolutionally decoded in block 56. In block 58, error detection is performed on the decoded information bits. As represented by block 60, a determination is made whether an error was detected. If the decoded information bits pass the error detection process, process flow continues in block 62. In block 62, the decoded information bits are passed to the next processing layer and process flow for the group of information bits is complete in end block 64.

If the decoded information bits fail the error detection process, process flow continues to block 70. Block 70 is used to limit the number of times that any one group of symbol data is decoded. Block 70 determines whether the number of attempts to decode the symbol data has exceeded an allowable maximum. If not, the bits can be reencode in an optional process block 66, in the same manner as they were encoded at the transmitter. If the optional reencoding of process block 66 is used, the re-encoded symbol stream may be used to determine the polarity of the non-zero filling for the punctured bits in the next iteration. However, as described above, reencoding is not necessary and simply another set of values according to one of the permutations of the potential combinations of quantized soft decision values can be used. In block 68, the one or more of punctured bits are replaced with a new set of non-zero values. The new symbols are once again convolutionally decoded in block 56 and process flow continues as described above.

If in block 70, the number of attempts to decode the symbol data has exceeded the allowable maximum, a failure indication is passed to the next processing layer in block 72 and process flow terminates for this group of symbol data in block 64.

Under the prior art, the erasures inserted in the decoding process provide no contribution to the decoding process. Under the invention, the selected non-zero values have a positive contribution to the decoding process.

The invention is elegant for a number of reasons. For example, the process described does not require any change to the transmitting unit. Thus, an improvement in error rate may be made without modifying existing transmission units. For example, if the invention is applied to a cellular system comprised of a set of base stations and a plurality of remote units which may move around within the coverage area of the base stations, the invention may be implemented within the base station but not within the remote units. In another embodiment, a subset of the remote units may be modified to include the invention. For example, in a wireless local loop environment, the cost, size and power consumption of the remote unit is less critical than in the typical mobile wireless environment. Therefore, the invention may be implemented in wireless local loop subscriber stations even if it is not implemented in the mobile remote units which utilize the same base station infrastructure.

The invention may be implemented in a variety of media including software, firmware and hardware or a combination of these. A typical embodiment of the invention comprises computer software which executes on a standard microprocessor. Other typical embodiments of the invention may comprise an application specific integrated circuit (ASIC) specifically designed to carry out the invention.

Many other permutations of the invention other than the exemplary embodiments given above also come within the scope of the invention. For example, only a subset of the missing symbols may be replaced with non-zero values while others are left as erasures. The invention could be applied to in a system in which hard decision rather than soft decision data is decoded. In such a case, the non-zero values would be either 1 or −1.

In addition to the data puncturing environment described above, the invention may be applied in situations where the interference source is not the transmitter of the desired signal. The invention may be applied generally to any situation in which a determinable pattern of interference results in known missing data symbols at the receiving unit. The invention is applicable in both wireless and wireline environments.

Also, it is not necessary that the first attempt to decode the symbol stream comprise only zero values. Particularly, if the symbol information is patternistic or biased toward a certain polarity, it may be advantageous to use non-zero values for the first attempt at convolutional decoding. In such a case, if the first attempt fails, one of the successive attempts may involve inserting a series of erasures. Likewise, a variety of error detection mechanisms can be integrated to work with the invention besides the exemplary CRC method described above.

Other variations within the scope of the invention are also obvious such as the simple rearrangement of the process blocks in the exemplary flow chart at FIG. 3. For example, in an efficient implementation, the process blocks shown in FIG. 3 may be executed in parallel. Likewise, additional architectures other than the exemplary configuration given in FIG. 3 will also be apparent. For example, the use of the convolutional decoder may be multiplexed between original and successive attempts to decode or a separate convolutional decoder may be dedicated to the successive attempt processing.

The convolutional encoder shown in FIG. 3 is purely exemplary. The invention is applicable to a wide variety of convolutional encoding and decoding schemes including encoding schemes using a variety of different rates, different constraint lengths and different tap values.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A method of decoding an incoming symbol stream comprising a first plurality of bits, the first plurality of bits originating from an original plurality of bits from which ones of said original plurality of bits were deleted, comprising the steps of:
   filling said first plurality of bits with a first set of replacement values to replace the deleted ones of said original plurality of bits to generate a first reconstructed approximation of said original plurality of bits;
   convolutional decoding said first reconstructed approximation of said original plurality of bits to produce a first decoded information bit stream;
   performing error detection on said first decoded information bit stream;
   indicating whether errors are present in said first decoded information bit stream;
   modifying the first set of replacement values with a second set of replacement values, different at least in part from said first set of replacement values to create a second reconstructed approximation of said original plurality of bits;
   convolutional decoding said second reconstructed approximation to produce a second decoded information bit stream;
   performing said error detection on said second decoded information bit stream; and
   indicating whether errors are present in said second decoded information bit stream.

2. The method of claim 1, further comprising, the steps of:
   if errors are detected in the second decoded information bit stream,
   repeating said modifying, convolutional decoding, performing and indicating steps until a maximum number of attempts is completed or an error free bit stream is detected.

3. The method of claim 1, wherein said incoming symbol stream comprises soft decision data values.

4. The method of claim 1, wherein said second set of replacement values comprises at least some small non-zero values.

5. The method of claim 1, further comprising the step of re-encoding said first decoded information bit stream to produce a first re-encoded symbol stream and using the re-encoded symbol stream in a determination of at least some values within said second set of replacement values.

6. A method of decoding an incoming symbol stream, said incoming symbol stream comprising an original symbol stream comprising a first plurality of bits, the first plurality of bits comprising an original plurality of bits with ones of said original plurality of bits deleted, comprising the steps of:
   filling said first plurality of bits with a first set of replacement values which replace the deleted ones of said original plurality of bits to create a first modified symbol stream;
   convolutionally decoding said first modified symbol stream to produce a first decoded information bit stream;
   performing error detection on said first decoded information bit stream; and
   if errors are present in said decoded information bit stream, said method further comprising the steps of:
      filling said first plurality of bits with a second set of replacement values to replace the deleted ones of said original plurality of bits, said second set of replacement values different, at least in part, from said first set of replacement values to generate a second modified symbol stream;
      convolutionally decoding said second modified symbol stream to produce a second decoded information bit stream; and
      performing said error detection on said second decoded information bit stream.

7. The method of claim 6, further comprising the step of if errors are present in said decoded information bit stream, re-encoding said first decoded information bit stream to produce a first re-encoded symbol stream.

8. The method of claim 6, wherein said incoming symbol stream comprises soft decision data values and wherein said first set of values is a set of erasure values and said second set of values comprises a set of at least one non-zero value.

9. The method of claim 8, wherein a polarity of at least one value of said second set of values is determined based on the result of the first convolutional decoding step.

10. The method of claim 6, wherein said step of performing error detection comprises the steps of:
   calculating a received CRC value for said first decoded information bit stream;

comparing said received CRC value to an appended CRC value within said first decoded information bit stream;

failing said first decoded information bit stream if said appended CRC value does not match said received CRC value; and passing said first decoded information bit stream if said appended CRC value matches said received CRC value.

11. A method of decoding an incoming symbol stream comprising a first plurality of bits, the first plurality of bits comprising an original plurality of bits with ones of said original plurality of bits overwritten with alternative bits, said method comprising the steps of:

receiving said incoming symbol stream;

replacing said alternative bits with a first set of replacement values to generate a first reconstructed approximation of said original plurality of bits;

convolutionally decoding said first reconstructed approximation to produce a first decoded information bit stream;

performing error detection on said first decoded information bit stream to ascertain whether errors are present in said first decoded information bit stream; and replacing said alternative bits with a second set of replacement values to generate a second reconstructed approximation of said original plurality of bits if an error is detected.

12. The method of claim 11, further comprising the step of removing the alternative bits from said incoming symbol stream.

13. The method of claim 12, further comprising the steps of storing said alternative bits.

14. An apparatus for decoding an incoming symbol stream having a plurality of known missing symbols, said apparatus comprising:

means for replacing said plurality of known missing symbols with a first set of values to create a first modified symbol stream;

means for convolutional decoding said first modified symbol stream to produce a first decoded information bit stream;

means for performing error detection on said first decoded information bit stream;

means for re-encoding said first decoded information bit stream to produce a first re-encoded symbol stream if said first decoded information bit stream fails said error detection;

means for replacing said plurality of known missing symbols within the re-encoded symbol stream with a second set of values to create a second modified symbol stream;

means for convolutional decoding said second modified symbol stream to produce a second decoded information bit stream; and means for performing error detection on said second decoded information bit stream.

15. The apparatus of claim 14, further comprising:

means for re-encoding said second decoded information bit stream to produce a second re-encoded symbol stream if said second decoded information bit stream fails said error detection;

means for replacing said plurality of known missing symbols within said second re-encoded symbol stream with a third set of values to create a third modified symbol stream;

means for convolutional decoding said third modified symbol stream to produce a third decoded information bit stream; and means for performing error detection on said third decoded information bit stream.

16. The apparatus of claim 14, wherein said incoming symbol stream comprises soft decision data values and wherein said first set of values is a set of erasure values, said second set of values comprises a set of at least one small non-zero value and said third set of values comprises a set of at least one larger non-zero value.

17. The apparatus of claim 14, wherein said incoming symbol stream comprises soft decision data values and wherein said first set of values is a set of erasure values and said second set of values comprises a set having at least one non-zero value.

18. The apparatus of claim 14, wherein said plurality of known missing symbols carry a punctured sub channel.

19. An apparatus for decoding convolutionally encoded symbol data having a plurality of punctured symbols, said apparatus comprising:

a demodulator having a soft decision symbol output;

a depuncture logic having a symbol input in communication with said soft decision symbol output of said demodulator, said depuncture logic configured to replace said punctured symbols with at least one non-zero soft decision value, said depuncture logic having a modified symbol stream output;

a convolutional decoder having a symbol input in communication with said modified symbol stream output of said depuncture logic and having a decoded information bit stream output;

a processing unit having a data input in communication with said decoded information bit stream output of said convolutional decoder;

an encoder having a bit input in communication with said decoded information bit stream output of said convolutional decoder and a symbol output in communication with said symbol input of said depuncture logic; and an error detection module in said processing unit, said error detection module configured to determine whether errors are present in said decoded information bit stream output of said convolutional decoder, said depuncture logic configured to successively replace said puncture symbols with alternate soft decision values until an error-free decoded information bit stream is detected or a maximum number of trials is reached.

20. The apparatus of claim 19, further comprising:

a processing unit in communication with said depuncture logic, said processing unit configured to control the value to use for replacing said punctured symbols, said values selected from soft decision values.

21. The apparatus of claim 20, wherein said depuncture logic comprises a multiplexer, and wherein said processing unit communicates replacement values to an input of said multiplexer.

* * * * *